United States Patent
Ito et al.

(10) Patent No.: US 6,274,505 B1
(45) Date of Patent: Aug. 14, 2001

(54) ETCHING METHOD, ETCHING APPARATUS AND ANALYZING METHOD

(75) Inventors: Shoko Ito, Yokohama; Mokuji Kageyama, Iwate-Ken, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/387,801

(22) Filed: Sep. 1, 1999

(30) Foreign Application Priority Data

Sep. 2, 1998 (JP) ................................. 10-248626

(51) Int. Cl.[7] ................................................... H01L 21/00
(52) U.S. Cl. ............................ 438/745; 216/84; 216/92; 216/99; 438/8; 438/748; 438/753
(58) Field of Search ............................ 438/704, 706, 438/745, 748, 753, 8; 216/58, 59, 60, 92, 99, 84; 156/345 LP, 345 LC

(56) References Cited

U.S. PATENT DOCUMENTS 3,677,848 * 7/1972 Stoller et al. .................... 438/753 X
4,543,171 * 9/1985 Firester et al. .................... 438/753 X
5,846,374 * 12/1998 Parab et al. ...................... 438/747 X
5,904,572 * 5/1999 Lee et al. ......................... 438/753 X

FOREIGN PATENT DOCUMENTS 9-162160   6/1997 (JP).
9-260341  10/1997 (JP).

* cited by examiner

*Primary Examiner*—William Powell
(74) *Attorney, Agent, or Firm*—Oblon, Spivak, McClelland, Maier & Neustadt, P.C.

(57) ABSTRACT

By locally heating or cooling a substrate in an etching process, temperature unevenness is controlled, and convection currents of an etching liquid are restricted simultaneously. By setting the etching temperature low in an initial stage of the etching process and increasing it in a final stage, uniform and quick etching is possible. In a drop etching method, generation of bubbles can be prevented to ensure uniform etching by providing gas release openings in a member opposed to the substrate.

20 Claims, 13 Drawing Sheets

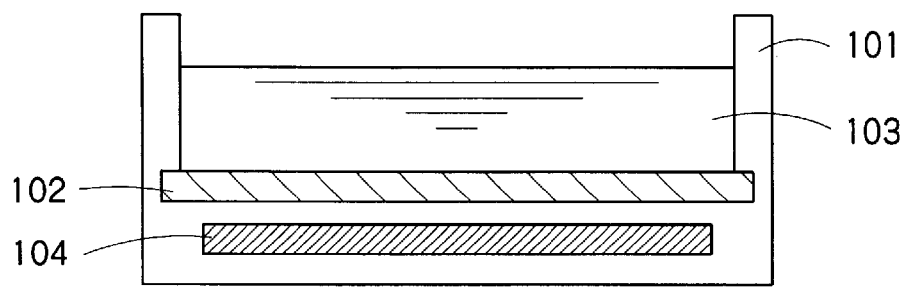
F I G. 1
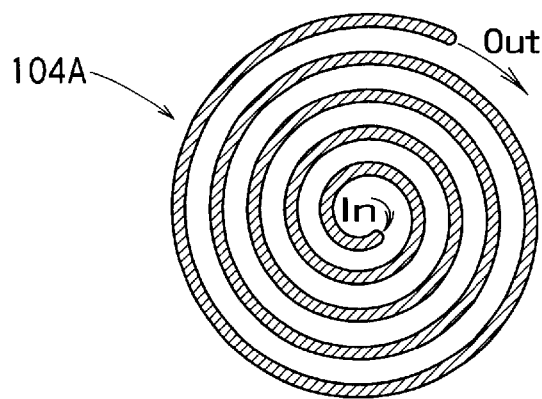
F I G. 2
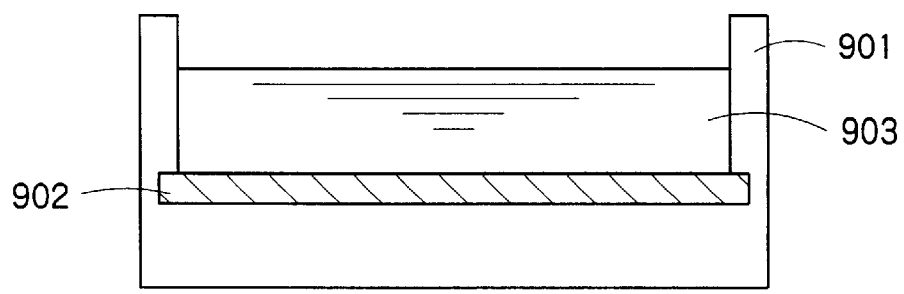
Related Art  F I G. 3

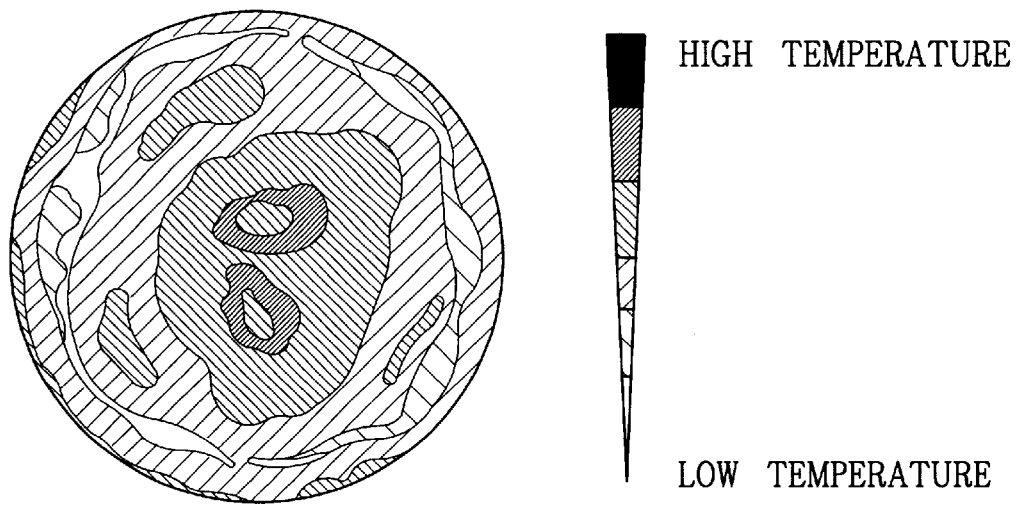
FIG. 4
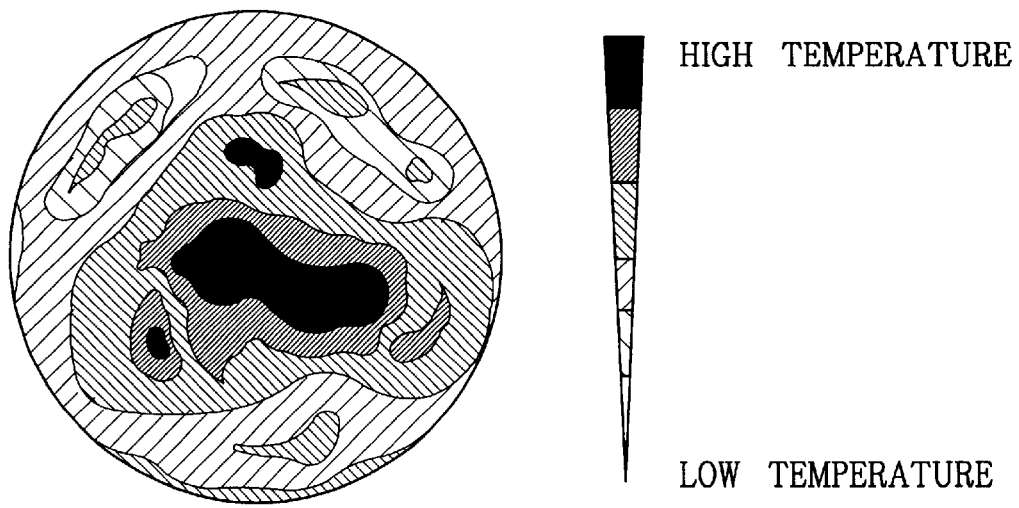
Related Art  FIG. 5

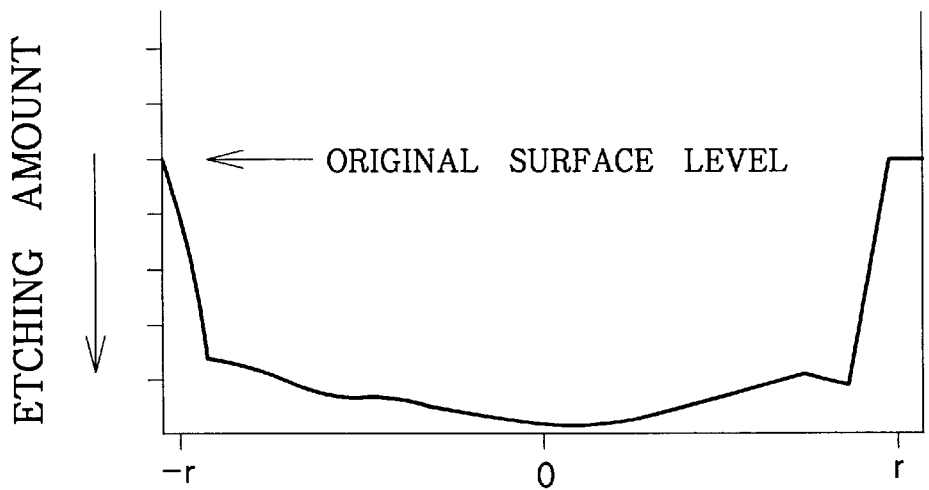
F I G. 6
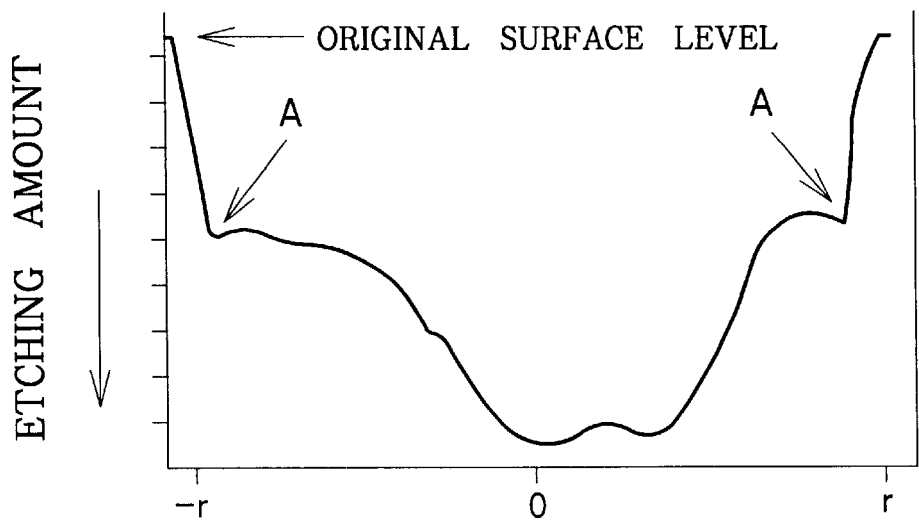
Related Art  F I G. 7

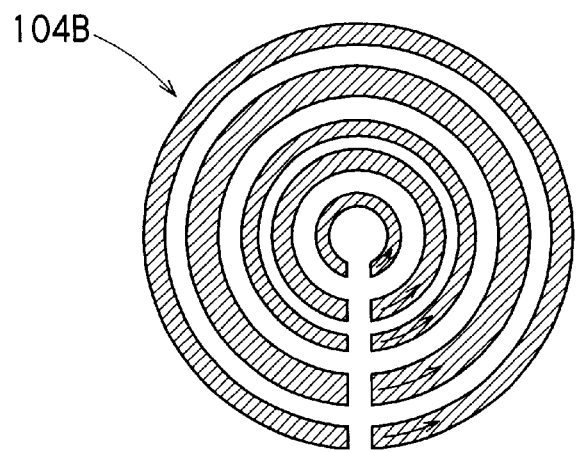
F I G. 8
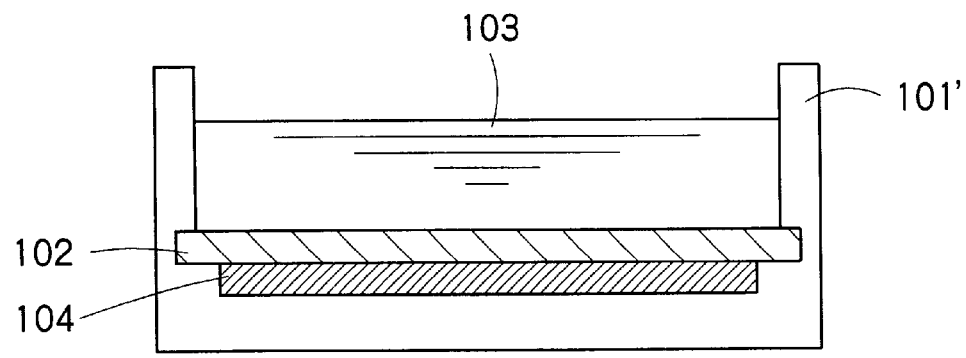
F I G. 9

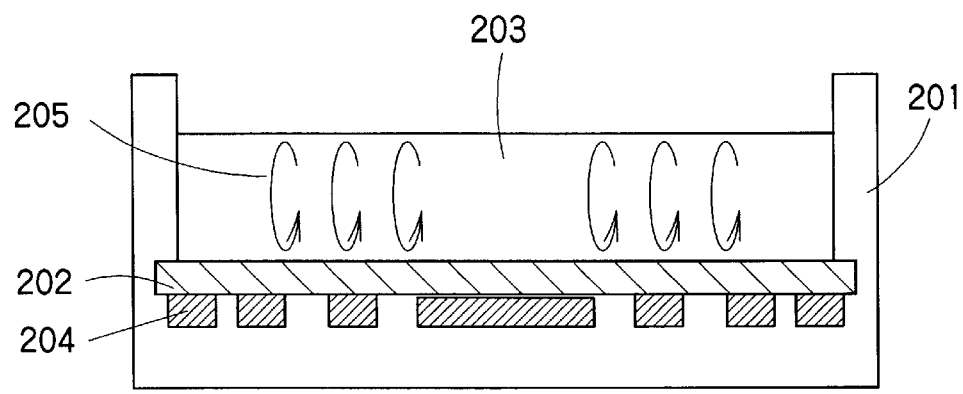
F I G. 10
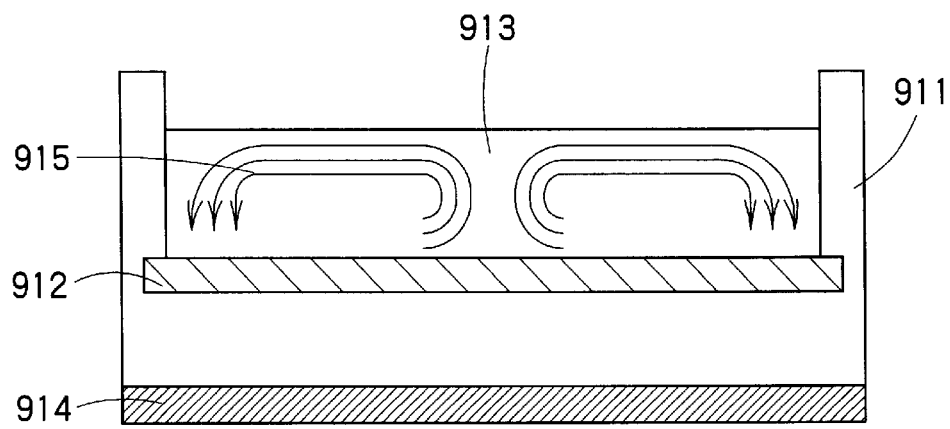
F I G. 11

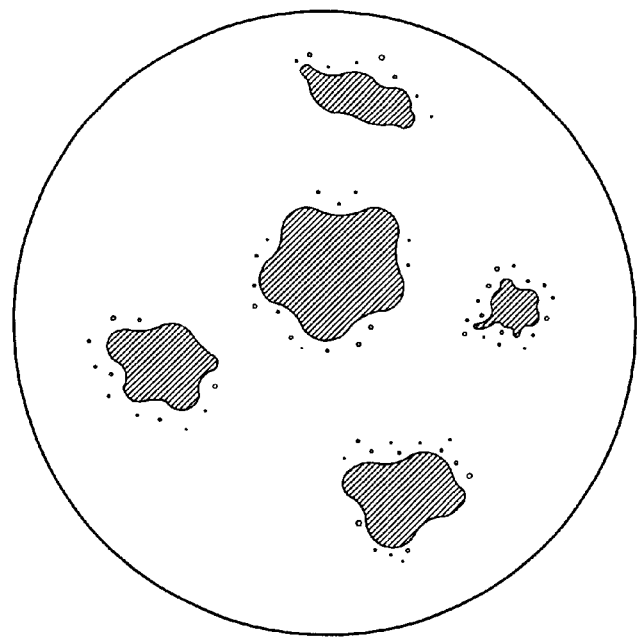
F I G. 12
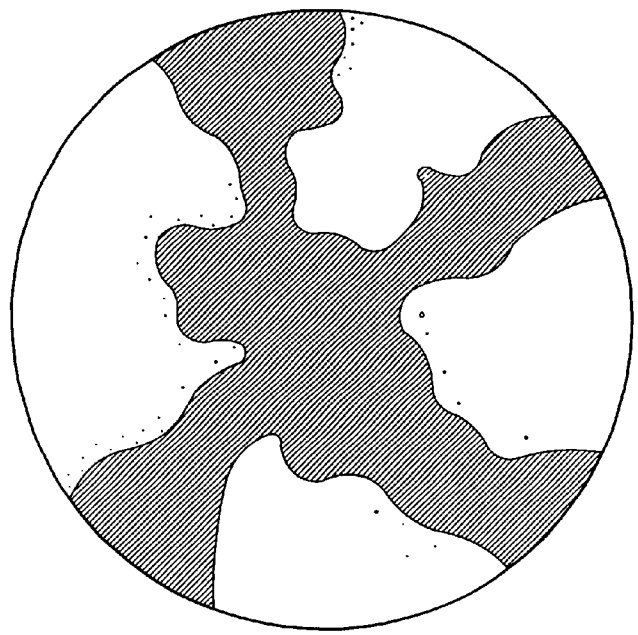
F I G. 13

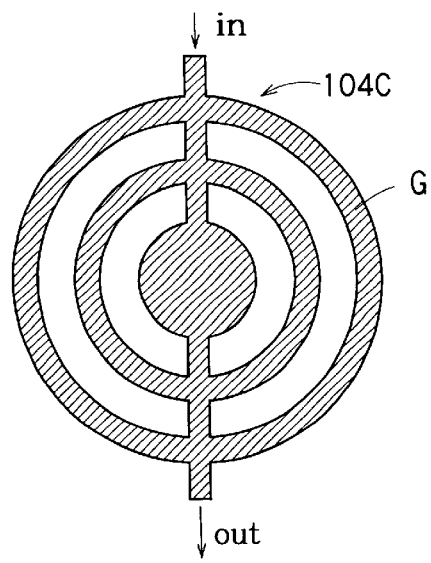
F I G. 14A
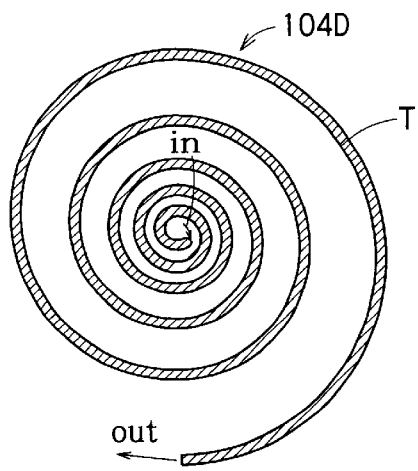
F I G. 14C
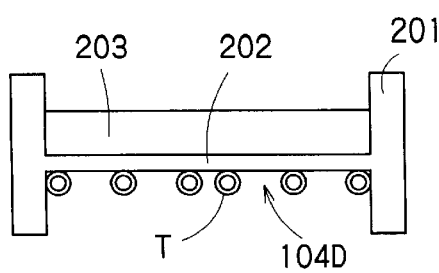
F I G. 14B
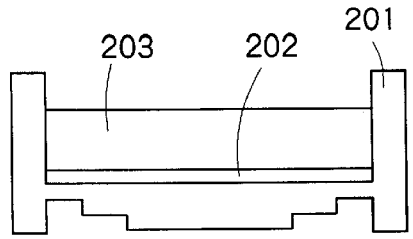
F I G. 14D
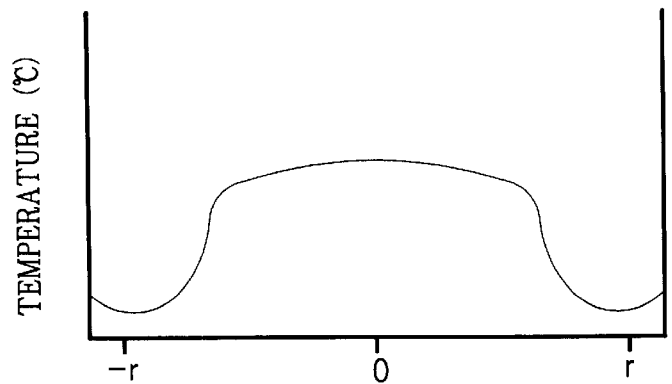
F I G. 14E

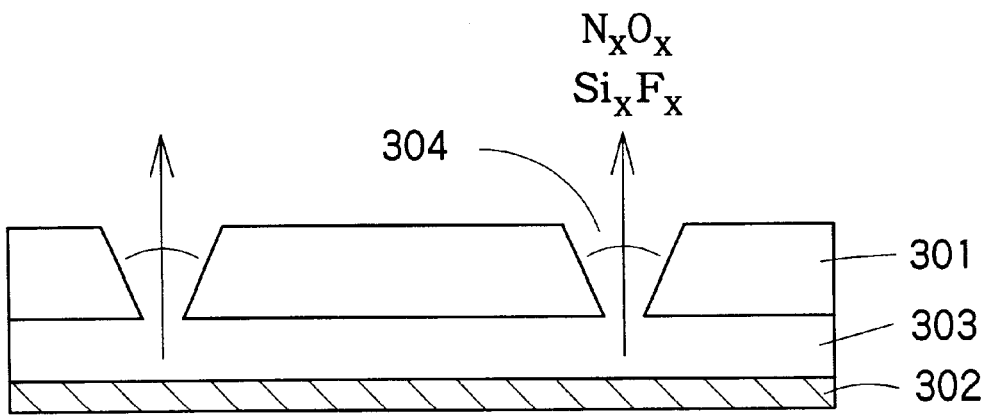
F I G. 15
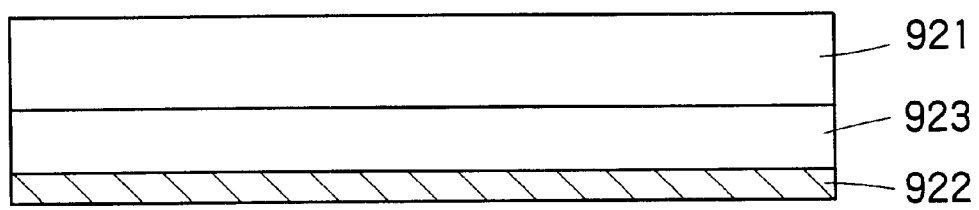
F I G. 16

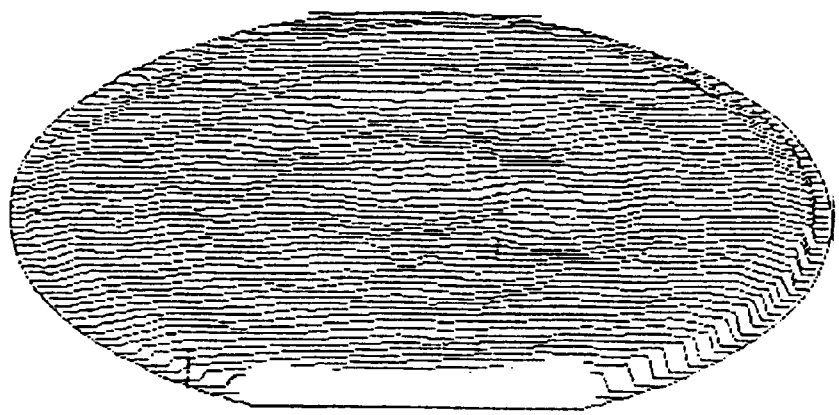
F I G. 17
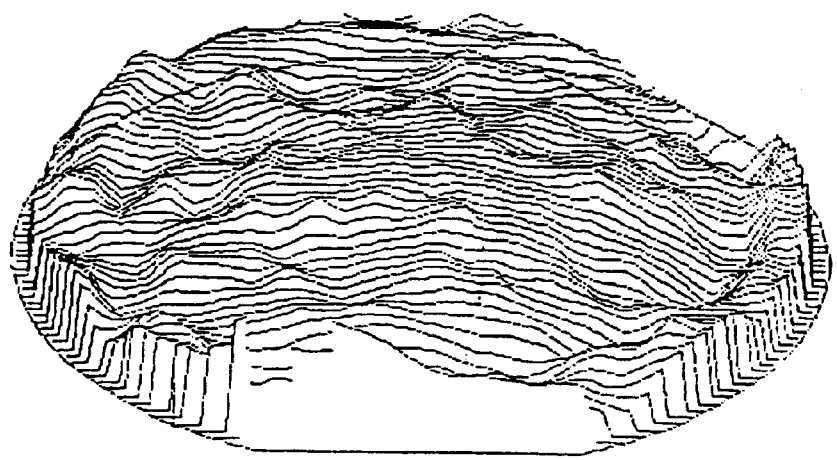
F I G. 18

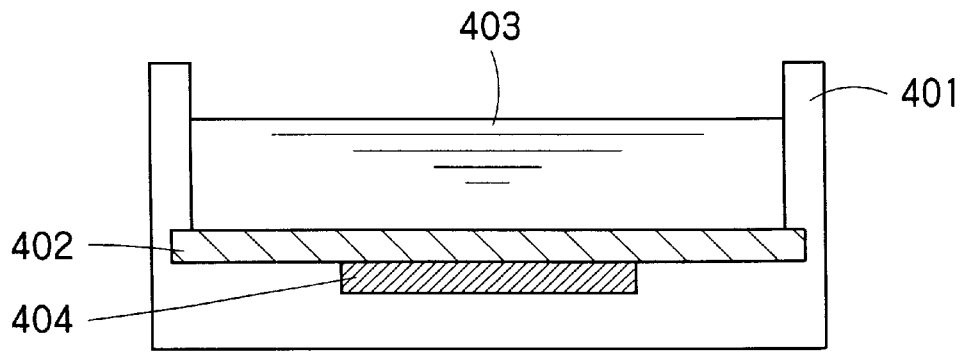
F I G. 19
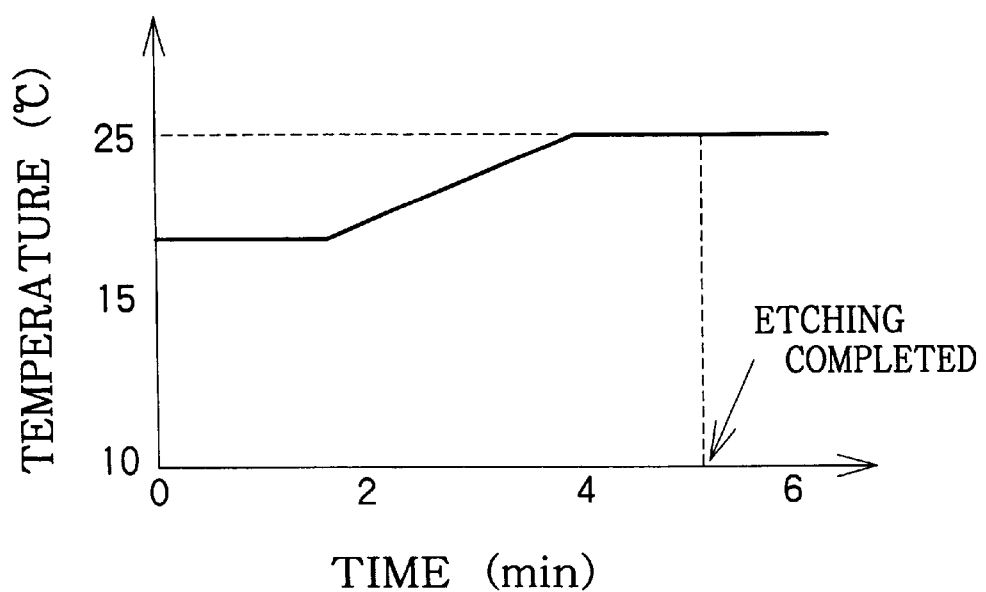
F I G. 20

ETCHING METHOD, ETCHING APPARATUS AND ANALYZING METHOD

BACKGROUND OF THE INVENTION

This invention relates to an etching method, etching apparatus and analyzing method. More particularly, the invention relates to an etching method, etching apparatus and analyzing method used for detecting impurities contained in a semiconductor substrate, semiconductor thin film, and so forth, by chemical analysis with a high sensitivity.

Sodium (Na), iron (Fe) and other various metal impurities existing in semiconductor thin films and semiconductor substrates invite deterioration in insulation-to-voltage property of oxide films and production of crystallographic defects therein, and therefore greatly affect the characteristics of semiconductor devices. Taking it into consideration, device manufacturing processes usually include a step of removing metal impurities from device-making regions by washing or gettering. Recently, however, the industry is under rapid progress toward higher integration, miniaturization and higher performance of semiconductor devices. Along this tendency, allowance to metal impurity concentration is getting lower and lower, and much higher sensitivity and reliability are required in impurity analysis for controlling contamination. Simultaneously, there is a strong demand for a method not only capable of conventional surface analysis but also capable of analyzing impurities contained in bulk of semiconductor thin films and substrate surface layers for actually making devices.

As one of methods for analysis of impurities contained in bulk of substrates, SIMS (secondary ion mass spectroscopy) is now being used widely. This method has large advantages, e.g., high resolution as high as 1 $\mu$m or less, ability of analysis in a depth direction, and availability for analyzing various substances from hydrogen (H) to uranium (U). However, its detectable limit for Fe, representative contaminant, is as high as $10^{15}$ atoms per cm$^3$, which is insufficient as the sensitivity required today for appreciating contamination.

On the other hand, electric methods such as DLTS (deep level transient spectroscopy), $\mu$-PCD (photoconductivity decay) or SPV (surfacephoto voltage) have very high sensitivities, as their detectable limit as high as $10^{10}$ atoms per cm$^3$ represents. However, there is a large restriction in measurable substrates and elements, and their application is limited to certain purposes.

Chemical analysis, which etches a substrate and analyzing impurities in the etching solution, is somewhat complex and requires a sill to conduct it. However, it is greatly advantageous in promising a high sensitivity with its detectable limit being as high as $10^{11}$ to $10^{14}$ atoms per cm$^3$ and in having no restriction in detectable substrates and elements. Representative one of such methods is disclosed by Takenaka et al. in "Analytic Chemistry" (Vol. 43, pp. 173–176 (1994)). This is a step etching method which etches a substrate fixed in a Teflon-made decomposition vessel by injecting a HF/HNO$_3$ mixed solution on the substrate surface. There is another method disclosed by M. Shabani et al. in Proceedings of 41st Joint Symposium of Japan Society of Applied Physics No. 2, p 598. This is a drop etching method in which a HF/HNO$_3$ mixed solution is sandwiched between a Teflon plate and a silicon substrate, and the surface of the silicon substrate is etched.

All of these techniques are characterized in dissolving silicon (Si) by exothermic reaction expressed by three formulas shown below, then changing the etching depth by changing the HF concentration in the mixed solution (the HF concentration and the etching depth are proportional), and thereby enabling analysis in the depth direction.

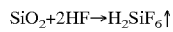

Additionally, by further concentrating the etching solution, these techniques can further increase the sensitivity.

In order to lower the detectable limit and increase the sensitivity in chemical analysis, it is necessary to reduce contamination from outside and increase the sensitivity of an analyzer. Since the requirement to analyzer is not easy to realize, current development is centrally directed toward techniques for reducing external contamination. "External contamination" herein pertains to the following three modes of contamination.

(1) contamination from reagents used (contamination contained in reagents)

(2) contamination from environments of analysis (clean room and booth for analysis)

(3) contamination from tools for analysis Among these modes of contamination, (1) contamination from reagents is currently the most important issue. If the amount of impurities contained in a reagent, the back ground level of impurities becomes high and the detection sensitivity decreases. To prevent this problem, a reagent with a super-high purity must be used for analysis. However, as the used amount increases, the amount of contamination also increases so much, and the back ground level of impurities increases accordingly. Therefore, it is important to minimize the used amount of reagents in impurity analysis.

Regarding (2) contamination from environments, even when works are conducted in a clean booth of the class 10 or higher installed in a clean room having a cleanness of the current class 100 or higher, there is still a possibility of contamination, depending on elements. Therefore, works of analysis (decomposition and concentra-tion) must be finished in minimum time. Regarding tools for analysis, by using Teflon as the material and washing it well before analysis, reduction of contamination to zero has been accomplished. In relation to the above-made explanation, advantages and problems of step etching and drop etching are summarized in Table 1.

TABLE 1

Advantages and Problems of Step Etching and Drop Etching

| | Step Etching | Drop Etching |
|---|---|---|
| Etching depth (6 inches) | 0.01~10 $\mu$m | 0.1~1 $\mu$m |
| Amount of Chemicals | 10 ml | 1 ml |
| Decomposition Time | 5 minutes | 5 minutes |
| Advantages | •Etching to a deep region is possible (etching under over-supply of HNO$_3$) | •No contamination by chemicals (using very small amount of chemicals) <br> •No contamination from environments (time for concentration is short (<1 hr)) |

TABLE 1-continued

Advantages and Problems of Step Etching and Drop Etching

| | Step Etching | Drop Etching |
|---|---|---|
| Problems | •Contamination by reagents (relatively large amount of reagents is used)<br>•Contamination from environments (due to a long time for concentration)<br>•Over-etching in form of an inverted cone getting deeper toward the central portion of the substrate (FIG. 7) | •Maximum etching depth is 1 μm (because of shortage of HNO$_3$, reaction does not progress beyond 1 μm)<br>•Uneven etching due to existence of a plurality of mountains on the etching surface (FIG. 8) |

Today's most serious problems in Table 1 is unevenness of etching. Such etching unevenness becomes a serious problem especially in case of epitaxial wafers and SOI (silicon on insulator) wafers which need analysis of respective layers. A solution for increasing surface evenness of etching would be executing gentle etching by decreasing HF (hydrofluoric acid) concentration. However, this is not practical because it invites an increase of the amount of etching solution and causing the above-indicated problem, i.e., increase of the background level of impurities. Additionally, each technique optimizes the amount of the reagent it uses upon development thereof, and it is undesirable to change the amount of liquid also from the viewpoint of etching accuracy.

It would be also possible to decrease the temperature for reaction, taking account of etching being exothermic reaction, as means for increasing the surface evenness. However, it has been known to the Inventor through experiments that this retards the etching reaction itself and largely increases the time required. The Inventor further made a trial for uniform etching by continuously stirring the etching solution. However, this was also ineffective to improve the surface evenness, and stirring was rather liable to invite contamination from environments and could not overcome the problem.

SUMMARY OF THE INVENTION

It is therefore an object of the invention to provide an etching method and an etching apparatus promising uniform etching of a substrate with an acid, and an analyzing method using the etching method.

To attain the object, the invention enables uniform etching by controlling the temperature. If etching unevenness is caused by the speed of etching reaction, etching is executed while cooling a substrate fixed in a decomposition vessel capable of cooling a portion of the substrate, such as a central portion thereof, where over-etching is liable to occur. In this manner, etching reaction of the central part of the substrate can be controlled, and uniform etching is possible.

If etching unevenness is caused by convection currents produced in a solution by etching reaction, that is, when convection currents rising from a central portion of the substrate and descending at outer circumferential portions occur, for example, by cooling the central portion of the substrate during etching, it is possible to control generation of convection currents and to significantly improve the etching uniformity.

That is, according to the invention, there is provided an etching method for etching a surface of an object by exposing the surface of the object to en etching liquid, comprising: heating or cooling said surface of said object, said heating or cooling being conducted unevenly on a space basis or a time basis in order to make etching of said object progress uniformly over the entirety of said surface.

The heating or cooling can be conducted locally on said surface of said object.

The surface can be heated or cooled to minimize a temperature difference between a central part of the surface and a circumferential part of the surface exposed to the etching liquid during etching.

Alternatively, the surface can be preferably heated or cooled to restrict convection currents of the etching liquid occurring between a central part of the surface and a circumferential part of the surface exposed to the etching liquid during etching.

According to the invention, there is further provided an etching method for etching a surface of an object by sandwiching an etching liquid in a gap between the object and a plate member facing to the object, comprising:

providing the plate member with a permeable means for permitting gases to pass through, and externally releasing gases generated by etching through the permeable means.

The permeable means permitting gases to pass through may be at least one through hole formed in the plate member.

According to the invention, there is further provided an etching method for etching a surface of an object by exposing the surface of the object to an etching liquid, comprising:

controlling the temperature of the surface of the object to become higher in a final stage of etching than in an initial stage of the etching.

The object to be etched may be silicon, and the etching liquid may be an acidic solution.

According to the invention, there is further provided an etching apparatus for etching a surface of an object by exposing the surface of the object to an etching liquid, comprising:

heating or cooling means for locally heating or cooling the surface of the object to have etching of the object progress uniformly over the entirety of the surface.

The heating or cooling means can be configured to minimize a temperature difference between a central part of said surface and a circumferential part of the surface exposed to the etching liquid during etching.

Alternatively, the heating or cooling means is configured to restrict convection currents of the etching liquid occurring between a central part of the surface and a circumferential part of the surface exposed to the etching liquid during etching.

According to the invention, there is further provided an etching apparatus for etching a surface of an object by sandwiching an etching liquid in a gap between the object and a plate member facing to the object, comprising:

said plate member having a permeable means for externally releasing gases generated by etching.

The permeable means may be at least one through hole formed in the plate member.

According to the invention, there is further provided an etching apparatus for etching a surface of an object by exposing the surface of the object to an etching liquid, comprising:

means for controlling the temperature of the surface of the object to become higher in a final stage of etching than in an initial stage of the etching.

According to the invention, there can be further provided an analyzing method for measuring concentration of impurities contained in an object by analyzing an etching liquid by one of atomic absorption spectrophotometric analysis, high-frequency plasma mass spectrometry and total reflection X-ray fluorescence spectroscopy, the etching liquid being one used for etching a surface of the object uniformly over the entirety of the surface by exposing the surface of the object to the etching liquid while locally heating or cooling the surface of the object.

The invention is embodied as summarized above, and attains the following effects.

By locally controlling the temperature of the substrate when the substrate is etched by an acid, easy and uniform etching is promised without inviting external contamination. That is, when the substrate is etched by an acid, the substrate, holder or etching solution are selectively cooled at locations corresponding to portions where over-etching occurs in case of conventional techniques, or portions where the etching is slow are selectively heated, to control the etching reaction and to thereby realize uniform etching.

Additionally, when the substrate is etched by an acid, the substrate, holder or etching solution are locally cooled or heated to control convection currents occurring during etching reaction. Thus, prereaction etching solution can be brought into contact with the substrate uniformly over the entire surface thereof, and uniform etching is realized.

By providing a tool with release openings, gases generated by etching reaction are externally released. Therefore, generation of bubbles is prevented, the etching liquid uniformly contacts the substrate surface, and even etching is promoted.

Because the invention realizes etching of substrate, with good surface evenness, by using hydrofluoric acid/nitric acid mixed solution, it also enables precise etching and analysis of epitaxial layers of epitaxial substrates, BSP layers of BSP (back side polysilicon) substrates or thin-film layers of thin-film SOI (silicon on insulator) substrates, for example.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is an explanatory diagram schematically showing an etching method according to the invention;

FIG. 2 is a diagram roughly showing a plane-viewed structure of a cooling device 104;

FIG. 3 is a cross-sectional view roughly showing a conventional etching method executed for comparison;

FIG. 4 is an explanatory diagram showing a heat profile of a silicon substrate during etching of its surface by the present invention;

FIG. 5 is an explanatory diagram showing a heat profile of a silicon substrate during etching of its surface by a conventional method;

FIG. 6 is a diagram showing a profile of etching amount of a silicon substrate 102 etched by an embodiment of the invention;

FIG. 7 is a diagram showing a profile of etching amount by a conventional method;

FIG. 8 is a plan view roughly showing another example 104a of the cooling apparatus;

FIG. 9 is a diagram schematically showing a structure for bringing the cooling device into direct contact with the silicon substrate 102 to cool it;

FIG. 10 is an explanatory view schematically showing an etching method according to the second embodiment of the invention;

FIG. 11 is an explanatory view showing a method executed by the Inventor for comparison;

FIG. 12 is an explanatory diagram illustrating movements of ink poured into HF/HNO$_3$ mixed solution 203 during etching reaction in the second embodiment;

FIG. 13 is an explanatory diagram illustrating movement of ink during etching by a method as a comparative example;

FIG. 14A is a diagram showing a modified structure for preventing convection currents of an etching solution;

FIGS. 14B and 14C are cross-sectional and plan views schematically showing a modified cooling device;

FIG. 14D is a cross-sectional view schematically showing another example for adjusting the temperature profile of a wafer;

FIG. 14E is a diagram showing a temperature profile obtained when cooling an outer circumferential portion of a substrate;

FIG. 15 is a diagram schematically showing an etching method according to the embodiment;

FIG. 16 is a diagram schematically showing an etching method taken as a comparative example;

FIG. 17 is a bird's-eye view of a silicon substrate etched by the embodiment;

FIG. 18 is a bird's-eye view of a silicon substrate etched by the method shown in FIG. 16 as a comparative example;

FIG. 19 is a diagram schematically explaining an etching method according to the fourth embodiment;

FIG. 20 is a graph showing a temperature profile during etching;

DETAILED DESCRIPTION OF THE PREFERRED EMBODIMENTS

Figure 21A:
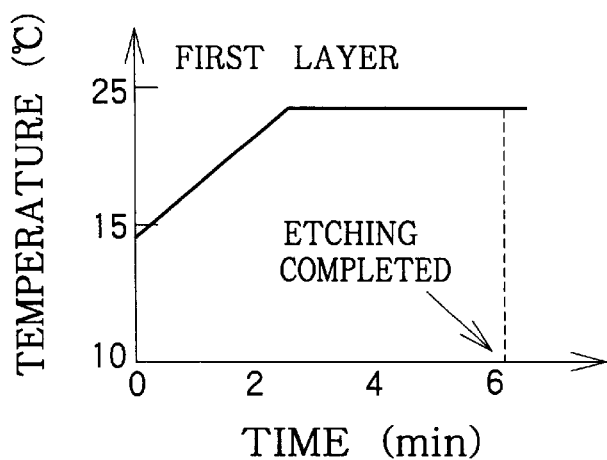
FIGS. 21A through 21C show an example of cooling sequence when etching a sample intentionally contaminated with iron (Fe) and copper (Cu) into a thin-film SOI substrate.

Embodiments of the invention are explained below with reference to the drawings.

FIG. 1 is an explanatory view schematically showing an etching method according to the invention. Reference numeral 101 denotes a decomposition vessel made of Teflon, 102 denotes a silicon (Si) substrate, 103 denotes HF/HNO$_3$ (hydrofluoric acid/nitric acid) mixed solution, and 104 denotes a cooling device.

FIG. 2 is a diagram roughly showing a plane-viewed structure of a cooling device 104. The cooling device 104 used in this embodiment is configured to cool the central part of a substrate more powerful than its outer circumferential portion. In the cooling device shown in FIG. 2, the flow path of a refrigerant is arranged spirally so that a fluid or gaseous refrigerant can flow outward from the center of the spiral. By flowing a refrigerant from the center, the central part of the substrate is cooled more powerfully than the outer circumferential portion.

In the etching procedure according to the invention, the silicon substrate 102 is first fixed in the decomposition vessel 101. Then, a refrigerant, such as cooling water (4° C.) is supplied to the cooling device 104 to cool the decomposition vessel 101 and the central part of the substrate 102 well. After that, HF/HNO$_3$ mixed solution 103 (HF:7.4%, HNO$_3$: 54.8%) is poured on the substrate 102 to start etching. Quantity of the mixed solution 103 is preferably around 10 ml for a 6-inch silicon wafer. With the mixed solution 103 poured, the temperature of the substrate increases by heat generated along with progress of etching.

The Inventor also conducted etching by a conventional etching method for comparison purposes. FIG. 3 is a cross-sectional view roughly showing the etching method used for comparison. In the etching method shown here, a silicon substrate 902 was put in a decomposition vessel 901 made of Teflon but having no cooling device, and HF/HNO$_3$ mixed solution 903 was poured for etching.

FIG. 4 is an explanatory diagram showing a heat profile of the silicon substrate during etching of its surface by the invention. FIG. 5 is an explanatory diagram showing a heat profile of the silicon substrate during etching of its surface by the conventional method.

In the substrate etched by the conventional method, steep "temperature unevenness" with a high temperature at the central part of the substrate and a low temperature along the circumferential portion is produced as shown in FIG. 5. In the present invention, however, "temperature unevenness" of the substrate is alleviated, and the temperature profile is closer to a uniform profile. This is because the refrigerant is supplied to the cooling device 104 having a spiral flow path to make it flow from its central part, which results in cooling the substrate most at its central part and gradually moderately toward its outer circumferential portion. That is, by using the cooling device 104, temperature difference between the central part and the outer circumferential part of the substrate can be minimized.

The difference in temperature profile results in a difference in over-etching amount.

FIG. 6 shows an etching amount profile of the silicon substrate 102 etched by the embodiment. FIG. 7 shows an etching amount profile obtained by the conventional method.

In the conventional method, over-etching occurred in form of an inverted cone getting deeper toward the center of the substrate as shown in FIG. 7. However, according to the invention, the etching amount is very even throughout the entire surface of the substrate as shown in FIG. 6, and an evenly etched surface is confirmed. Presumably, this is because, as a result of most powerfully cooling the central part of the substrate by the cooling device 104, increase of the etching rate by an increase of the temperature was effectively prevented.

That is, according to the invention, by using the cooling device to preferentially cool a central part of the substrate, excessive etching at the central part of the substrate is prevented, and a uniform etching profile is realized. As a result, multi-layered structures of thin films, like epitaxial wafers and SOI wafers, can be chemically analyzed precisely for each layer.

Details of the chemical analysis is disclosed, for example, in "Analytic Chemistry, Vol. 43, pp. 173–176 (1994)" introduced above. This literature explains in detail "electrotheimal vaporization/ICP (inductively coupled plasma) mass spectrometry", and those skilled in the art will readily conduct analysis, consulting the literature. More specifically, analysis can be done by extracting the solution after etching in the above-explained manner by using a micro pipette, for example, and injecting it into a graphite furnace of an analyzer.

If electrotheimal vaporization/ICP mass spectrometry is used, analysis with a very high sensitivity is possible, in which, for example, in case of the maximum etching depth being 10 μm, detectable limit of chromium (Cr) and iron (Fe) is 0.01 ng/g (8×10$^{11}$ atoms per cm$^3$) and detectable limit of nickel (Ni) and copper (Cu) is 0.005 ng/g (4×10$^{11}$ atoms per cm$^3$).

Highly accurate analysis can be made also by other techniques, such as atomic absorption spectrometric analysis and total reflection X-ray fluorescence spectroscopy.

The structure shown in FIG. 2 is configured not to cool the substrate edge too much by using the spiral cooling device 104 so that cooling water flows from the substrate center toward the radially outer end to maintain the substrate center at a lower temperature. The invention, however, is not limited to it.

FIG. 8 is a plan view schematically showing a cooling device 104a as another example. As shown here, a plurality of concentrically arranged flow paths are provided. Quantities of the refrigerant supplied to the flow paths and temperatures thereof may be adjusted individually to adjust the temperature profile of the substrate and to thereby prevent etching unevenness.

Although the structure shown in FIG. 1 has the cooling device 104 inside the body of the Teflon-made decomposition vessel 101, the cooling device 104 may be located to get into direct contact with the silicon substrate 102 and to cool it directly as shown in FIG. 9.

Although FIGS. 2 and 8 show cooling devices configured to cool the substrate by a refrigerant flowing therein, other modes of cooling may be employed to cool the substrate, like the use of ice or the use of a Peltier element and a sensor.

Moreover, to uniform the temperature profile of the substrate, the substrate may be selectively heated instead of being cooled. For example, by heating the circumferential portion of the substrate more than its central part, temperature unevenness of the substrate can be alleviated to promote etching substantially evenly. In this case, however, heating is preferably adjusted to prevent exposure of the surface of the silicon substrate due to vaporization of the etching solution.

Usable as the etching solution, in addition to mixed solution of hydrofluolic acid and nitric acid, are other linds of acid such as hydrochloric acid, sulfuric acid, phosphoric acid, and so on, to obtain the same effect.

Next explained is the second embodiment of the invention.

This embodiment is mainly directed to preventing convection in the etching solution.

FIG. 10 is an explanatory diagram showing an etching method according to the second embodiment. Reference numeral 201 refers to a decomposition vessel made of Teflon, 202 to a silicon substrate, 203 to HF/HNO$_3$ mixed solution, 204 to a cooling device, and 205 to a convex occurring in the etching solution. The cooling device 204 is configured to partly cool or heat the substrate 202 and to thereby prevent temperature unevenness. In this respect, it has a similar structure to that of the cooling device explained with reference to FIG. 2 of FIG. 8.

FIG. 11 is an explanatory diagram showing a method used by the Inventor for comparison purposes. In FIG. 11, numeral 911 refers to Teflon-made decomposition vessel, 912 to a Si substrate, 913 to HF/HNO$_3$ mixed solution, 914 to a device for uniformly cooling the entirety of the Teflon-made decomposition vessel 911, and 915 to a convection current occurring in the etching solution.

The Inventor put the silicon substrate 202 in the decomposition vessel 201 shown in FIG. 10, and cooling well central parts of the decomposition vessel 201 and the substrate 202 by using the cooling device 204. Then, the Inventor poured 20 ml of the HF/HNO$_3$ mixed solution 203 (with HF by 6.3% and HNO$_3$ by 56.7%) and started etching.

Similarly, the Inventor similarly started etching by the etching method shown in FIG. 11 as a comparative example. In both etching methods, immediately after starting etching, ink was softly poured in several locations on the silicon substrate not to move the surface of the solution, and observed movements of the ink.

FIG. 12 shows an explanatory diagram showing movements of several drops of ink poured into the HF/HNO$_3$ mixed solution 203 during etching reaction in the second embodiment. FIG. 13 is an explanatory diagram showing movement of ink during etching by the method as the comparative example.

In the etching method according to the invention, the ink slowly spread over a narrow area concentrically from each dropping point as shown in FIG. 12. In contrast, in the etching method as the comparative example, ink spread over a wide area from all dropping points, riding on a flow from the central portion of the substrate toward the end portion.

That is, in the etching method taken as the comparative example, even though the layer of the etching solution on the silicon substrate was as thin as 1 mm or less, a large convection current was confirmed in the etching solution as shown by reference numeral 915 in FIG. 11. Since the comparative example is configured to cool the entirety of the decomposition vessel, it inevitably causes a temperature profile in which the temperature is higher at the central portion of the substrate 912 than that of the circumferential portion. As a result, as the movement of ink in the etching solution 913 demonstrate, large convection currents from the central portion of the wafer toward outer circumferential portions occur. Under the existence of these convection currents, uneven etching as shown in FIG. 7 is liable to occur. For example, as shown at A in FIG. 7, there are over-etched portions along the outer circumference of the substrate. Presumably, they are caused by the etching solution 913 being forced by the convection currents 915 shown in FIG. 11 to flow downward along the inner wall of the decomposition vessel 911 and to get into contact with the substrate 912.

In contrast, according to the embodiment of the invention, since the substrate is locally cooled, no large convection current (horizontal components running radially outward from the wafer center) occurs in the etching solution. That is, in the embodiment shown here, small convection currents merely occur locally as shown by numeral 205 in FIG. 10. In order to prevent over-etching as shown at A in FIG. 7, it is important to restrict convection currents of the etching liquid to local convection currents within areas narrower than the radius of the wafer. Additionally, as shown in FIG. 10, the temperature is preferably adjusted for these local convection currents 205 to distribute uniformly over the wafer surface.

The embodiment shown here can restrict convection currents of the etching liquid to local ones which distribute uniformly over the wafer surface, and can therefore realize uniform etching over the entire surface of the substrate as shown in FIG. 6.

The Inventor made analysis of samples which were intentionally contaminated with iron (Fe) into p/p$^+$epitaxial wafers made by epitaxially growing a p-type silicon layer on a p$^+$-type silicon substrate, by using the method according to the embodiment and the method as the comparative example. Results of the analysis is shown in Table 2.

TABLE 2

| | Results of Analysis | | |
|---|---|---|---|
| Etching depth ($\mu$m) | 0~5 | 5~10 | 10~15 |
| Amount of Fe detected by the Embodiment (ng/g) | <0.3 | 4.0 | 3.2 |
| Amount of Fe detected by the comparative example (ng/g) | 0.9 | 3.6 | 3.3 |

It is generally known that p$^+$-type substrates exhibit a large gettering ability against Fe, and almost all of Fe introduced into the wafer is trapped by the p$^+$substrate and substantially no Fe exists in the epitaxial layer.

It is known, however, from the results shown in Table 2 that 0.9 (ng/g) of iron (Fe) was detected in the range from the surface to the depth of 5 $\mu$m in the comparative example. This demonstrates that over-etching into the p$^+$substrate beyond the epitaxial layer having the thickness of 5 $\mu$m undesirably occurred during etching. In contrast, in the embodiment of the invention, detected amount of iron (Fe) is less than the detectable limit (0.3 ng/g) in the range from the surface to the depth of 5 $\mu$m. This demonstrates that over-etching into the substrate was prevented and very uniform etching was attained. That is, the embodiment enables etching of the epitaxial layer alone by preventing over-etching, and can quite precisely perceive the concentration profile of impurities in the depth direction.

As explained, the embodiment shown here can better improve the etching evenness by locally cooling the substrate and thereby limiting convection currents of the etching solution.

Other than the example shown in FIG. 10, various structures are employable for limiting or preventing convection currents of the etching solution.

For example, grooves G may be provided in the Teflon-made decomposition vessel 201 as shown in FIG. 14A to supply water or other refrigerant into the grooves and to thereby cool a wafer put on the vessel 201. The plane-viewed configuration of the grooves G may be adjusted appropriately to cool a central portion or a outer circumferential portion of the wafer more powerfully so as to reduce temperature unevenness of the wafer and to thereby prevent large convection currents of the etching solution.

FIGS. 14B and 14C are cross-sectional and plan views schematically showing a modified cooling device. In this example, a tube T is provided in close contact with the lower surface of the bottom plate of the decomposition vessel 201. The tube T has a predetermined plane-viewed pattern as shown in FIG. 14C, for example. When it is desired to cool the central part of the wafer 202 especially well, for example, the tube T may be configured to be dense in the central part and scarce in the outer side. In contrast, when it is desired to cool the outer side of the wafer more powerfully than the central part, the tube T is configured to be dense in the outer side. In this example, the bottom plate of the decomposition vessel 201 is preferably thin enough to efficiently cool the wafer 202.

FIG. 14D is a cross-sectional view schematically showing another example for adjusting the temperature profile of a wafer. In this example, a profile is made in the thickness of the bottom plate of the decomposition vessel 201. It has been known to the Inventor through his own experiment that, in a structure with no means like a refrigerant attached to the bottom plate of the decomposition vessel 201, the thicker the bottom plate, the lower the temperature of the wafer during etching. Presumably, its reason lies in that the bottom plate made of Teflon, itself, functions as a heat sink absorbing heat from the wafer, and a thicker bottom plate has a larger heat absorbing capacity.

That is, in case of the example shown in FIG. 14D, since the bottom plate is thicker in the portion corresponding to the central portion of the wafer, the wafer is cooled more powerfully in the central portion than the outer side. As a result, temperature unevenness of the wafer is reduced, and more uniform etching is realized.

Although the above-explained examples are configured to cool only a limited part of the substrate, it is also possible to cool the entirety of the substrate while locally making a low-temperature region.

Alternatively, if it is appropriate, taking account of the relation between heat generated by etching and the ambient temperature, shape of the decomposition vessel, an so forth, only the outer circumferential portion of the substrate or a part of the circumference may be cooled.

FIG. 14E is a diagram showing a temperature profile obtained when cooling only an outer circumferential portion of a substrate.

As these examples show, according to the embodiment shown here, it is possible to improve the etching evenness by controlling the temperature profile of the substrate and preventing convection currents of the etching solution.

Next explained is the third embodiment of the invention.

This embodiment realizes an etching method enabling analysis of elements with a very high detection sensitivity by ensuring uniform etching by so-called drop etching using quite a small amount of etching solution.

Explained below is the embodiment with reference to FIGS. 15 through 18 and Table 3.

FIG. 15 is a diagram schematically showing an etching method according to the embodiment. Reference numeral 301 denotes a Teflon plate, 302 denotes a silicon substrate, 303 denotes a HF/HNO$_3$ mixed solution, and 304 denotes an air release opening.

FIG. 16 is a diagram schematically showing an etching method taken as a comparative example. Reference numeral 921 denotes a Teflon plate, 922 denotes a silicon substrate, and 923 denotes a HF/HNO$_3$ mixed solution.

When the etching solution is sandwiched between the substrate and the Teflon plate as shown in FIGS. 15 and 16, etching is possible with quite a small amount of etching solution. More specifically, even when using a 8-inch silicon wafer as the substrate, the required amount of etching solution is approximately 2 ml which is as little as approximately 1/10 even when compared with the examples shown in FIG. 1 and FIG. 10. As a result, the absolute amount of background impurities originally contained in the etching solution can be decreased, and the detection sensitivity of analysis can be improved significantly.

Concrete procedures of etching are as shown below. First, a predetermined amount of HF/HNO$_3$ mixed solution 303 (HF: 0.15%, HNO$_3$: 67.7%) is dropped onto the Teflon plate 301. This amount may be approximately 1 ml, for example, in case of a 6-inch wafer. After that, the substrate 302 is overlaid thereon with its surface to be analyzed being oriented downward, to sandwich the HF/HNO$_3$ mixed solution 303 between the substrate 302 and the Teflon plate 301 and to thereby start etching. In the embodiment shown here, it is desirable to place the substrate 302 at a lower position along a vertical line and place the Teflon plate 301 at a higher position along the vertical line.

FIG. 17 is a bird's-eye view of a silicon substrate etched by the embodiment. FIG. 18 is a bird's-eye view of a silicon substrate etched by the method shown in FIG. 16 as the comparative example. In the embodiment of the invention, the surface of the substrate is smooth as shown in FIG. 17, and uniform etching is realized. In contrast, in the comparative example, etching is not uniform, with severe unevenness on the substrate surface.

The difference between them in etching surface derives from influences of a gas generated by etching reaction. That is, etching reaction of silicon by HF/HNO$_3$ gas progresses as shown by the formulas shown below, gas is produced as the reaction progresses.

$$Si + 2HNO_3 \rightarrow SiO_2 + 2N_2O_3\uparrow + H_2O$$

$$SiO_2 + 4HF \rightarrow SiF_4\uparrow$$

$$SiO_2 + 2HF \rightarrow H_2SiF_6\uparrow$$

The nitric acid-based gas (N$_2$O$_3$, NO$_2$, etc.) and silicon fluoride (SiF$_3$, H$_2$SiF$_6$, etc.) generated in this manner accumulated in the HF/HNO$_3$ mixed solution, then produces bubbles along the substrate surface, and make the etching very uneven, in the comparative example shown in FIG. 16. Therefore, the etching surface results in having severe unevenness as shown in FIG. 18.

In contrast, in the embodiment of the invention, any gas generated by etching is externally discharged through the release openings 304 formed in the Teflon plate 301. As a result, no bubble is produced in the etching solution, and uniform etching as shown in FIG. 17 is realized.

When the release openings 304 are made in form of inverted cones with a somewhat small diameter, the etching solution 303 is held in the release opening 304 by surface tension as shown in FIG. 15. As a result, the etching solution does not flow out from the release openings 304, and the generated gas alone can be released externally.

The Inventor conducted impurity analysis of a thin-film SOI (silicon on insulator) substrate by using the etching method according to the embodiment. Table 3 shows results of this analysis.

TABLE 3

| | | Results of Analysis | | | |
| --- | --- | --- | --- | --- | --- |
| Impurity | Sample | Thin-film SOI layer 0~0.2 μm | Buried oxide film 0.2~0.4 | Support substrate 0.4~0.6 | Support substrate 0.6~0.8 |
| Iron (Fe) | Bonded SOI | <8.8 | <8.8 | <8.8 | <8.8 |
| Iron (Fe) | SIMOX | <8.8 | <8.8 | <8.8 | <8.8 |
| Copper (Cu) | Bonded SOI | 234 | 63 | 41 | 29 |
| Copper (Cu | SIMOX | <23 | <23 | 406 | 29 |

(Unit: ng/g)

The "bonded SOI" shown as a "sample" in Table 3 is a SOI sub-strate made by bonding two wafers, and "SIMOX (separation by implanted oxygen)" is a SOI substrate prepared by oxygen ionimplantion.

It is noted from Table 3 that a clear difference was detected in detected profile of copper (Cu) caused by the difference in manufacturing method betveen the bonded SOI and the SIMOX. That is, the embodiment of the invention can precisely analyze impurity profiles in thin-film silicon as very thin as 0.2 μm.

Positions and the number of release openings 304 in the embodiment may be determined appropriately, taking the substrate size and the kind of etching solution into consideration. Instead of making these release openings 304, a part of the silicon plate 301 may be replaced by any appropriate air-permeable material such as porous material or GORE-TEX (trade mark). Alternatively, the silicon plate 301 may be replaced by a plate made of one of these air-permeable materials.

Furthermore, using the nature that air solubility increases as the temperature decreases, the etching solution may be cooled to dissolve gases therein and to prevent generation of bubbles, so that the etching solution spreads uniformly.

Alternatively, etching may be done under a reduced pressure, using an amply degassed etching solution, and gases may be released from the etching solution. It is also possible to apply a pressure to dissolve gases into the etching solution and to prevent generation of bubbles.

Next explained is the fourth embodiment of the invention.

This embodiment is directed to realization of uniform etching by changing the temperature with time during etching and thereby reducing the etching time.

FIG. 19 is a diagram schematically explaining an etching method according to the fourth embodiment. In FIG. 19, reference numeral 401 denotes a decomposition vessel made of Teflon, 402 denotes a silicon substrate, 403 denotes a $HF/HNO_3$ mixed solution, and 404 denotes a cooling device. The cooling device 404 is configured to locally cool a central part of the substrate 402.

FIG. 20 is a graph showing a temperature profile during etching.

Also in the embodiment shown here, the silicon substrate 402 is fixed in the decomposition vessel 401 and cooled to 18° C. by the cooling device 404. After that, 10 ml of the $HF/HNO_3$ mixed solution 405 (HF: 0.08%, $HNO_3$: 67.8%) is poured onto the substrate 402 to start etchig. Two minutes later than the start of etching, the temperature of the etching solution 403 is elevated at the rate of 0.1 °C. per minute up to the room temperature (25° C.), and it is finally maintained at the room temperature for two minutes.

By first maintaining the temperature in low levels, the embodiment ensures uniform progress of etching. In ordinary etching reaction, violent reaction is liable to occur in initial stages where the etching liquid is fresh. Such violent etching reaction tends to invite uneven etching, and the etching surface is liable to become uneven due to over-etching. In contrast, if a low-concentrated etching solution is used to alleviate the etching reaction, then the absolute amount of the etching solution must be increased, and this invites the problem, an increase of the level of background impurities. Although the etching reaction can be alleviated by decreasing the temperature, there arises the problem that the time required for etching increases because of a decrease of the etching rate.

In contrast, according to the embodiment of the invention, since the temperature of the etching solution is maintained low to ensure uniform etching in initial stages where violent etching reaction is liable to occur, and thereafter increased. Thus, etching can be completed in a relatively short time. Additionally, since the amount of etching solution need not be increased, lowering of the detection sensitivity of impurities need not be worried about.

The Inventor prepared a CZ (Czochralski) substrate (IG (intrinsic gettering) substrate) intentionally contaminated with copper (Cu) and nickel (Ni) by precipitation annealing, conducted etching using the method according to the embodiment, and made analysis of impurities in the bulk. Table 4 shows results of the analysis.

TABLE 4

| Etching depth (μm) | Results of Analysis | | | |
|---|---|---|---|---|
| | 0~6 | 6~12 | 12~18 | 18~24 |
| Copper (Cu) | 0.40 | <0.36 | 4.5 | 45 |
| Nickel Ni | <0.41 | <0.41 | 9.3 | 84 |
| BMD | <2E + 4 | <2E + 4 | 2E + 5 | 1E + 6 |

In Table 4, the unit of detected amounts of copper (Cu) and nickel (Ni) is ng/g. "BMD" is an abbreviation of bulk micro defects, and its unit is pieces per $cm^2$. Densities of BMD were obtained by measuring pit densities after Wright etching.

From the results of Table 4, a clear correlation was found between impurity concentrations and BMD densities, and it is noted that impurities were caught by BMD by gettering.

In FIG. 19, the cooling device 404 for locally cooling the central portion of the substrate 402 is provided. However, a cooling device for cooling the entire substrate may be provided and controlled in temperature.

In FIG. 20, the initial temperature is 18° C., the rate for increasing the temperature is 0.1° C. per minute, and the temperature to be finally maintained is the room temperature (25° C.). However, according to an experiment by the Inventor, they may be determined otherwise in case of etching a silicon substrate, within the range of 0~27° C. as the initial temperature, 0.01~10°C. as the rate for increasing the temperature, and 4~50° C. as the temperature to be finally maintained.

Additionally, in FIG. 20, the temperature profile is made up of the step of holding a low temperature, the step of increasing the temperature and the step of maintaining a high temperature. However, the invention is not limited to it, and it is acceptable to combine these steps by several cycles as desired.

Figure 21B:
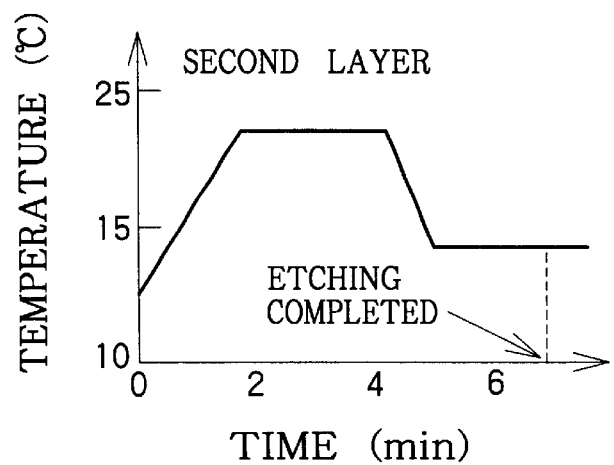
Figure 21C:
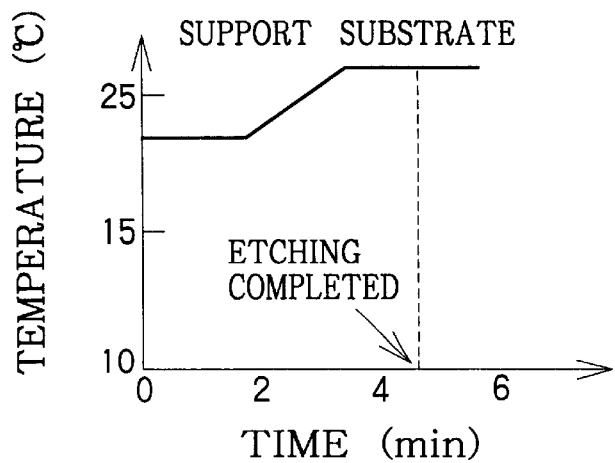

For example, FIGS. 21A through 21C show an example of cooling sequence when etching a sample which was intentionally contaminated with iron (Fe) and copper (Cu) into a thin-film SOI substrate. FIG. 21A is a temperature profile for etching the first layer (0~0.1 μm) of a thin-film silicon layer, FIG. 21B shows a temperature profile for etching the second layer of the thin-film silicon layer (0.1~0.2 μm), and FIG. 21C shows a temperature profile for etching a substrate under a buried oxide film. As shown here, by using an optimum temperature sequence for each etching layer, etching separating a thin-film silicon layer and a buried oxide film layer is possible even by using $HF/HNO_3$ with a low $Si/SiO_2$ selectivity.

Figure 22A:
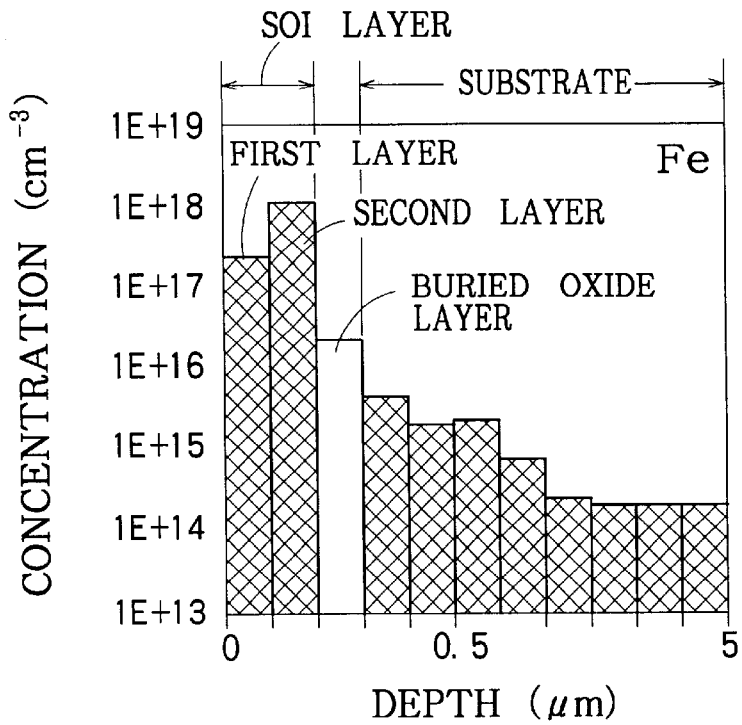
FIGS. 22A and 22B are graphs showing a result of analysis of impurities in a thin-film SOI substrate etched by using the temperature profile shown in FIGS. 21A through 21C.
Figure 22B:
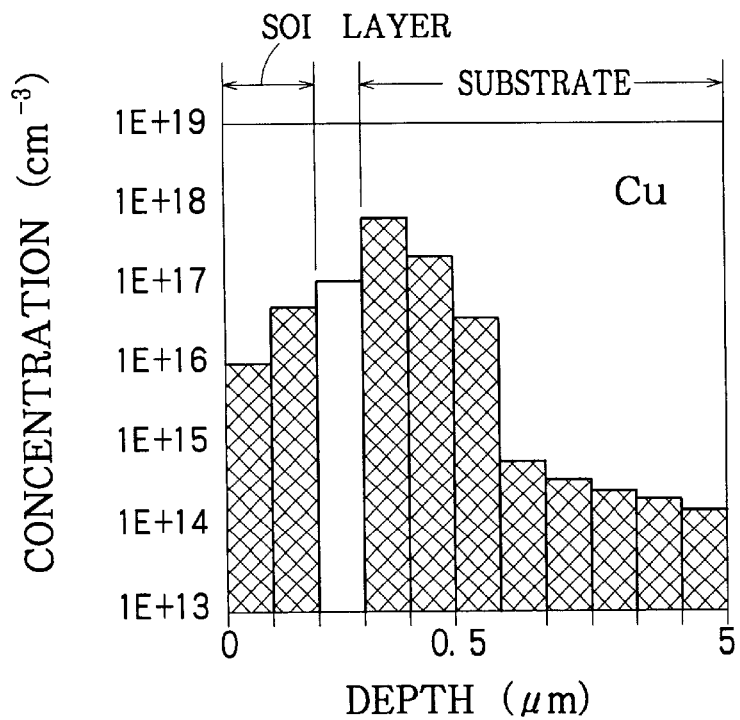

FIGS. 22A and 22B show a result of analysis of impurities in a thin-film SOI substrate etched by using the temperature profile shown in FIGS. 21A thruough 21C.

Figure 23:
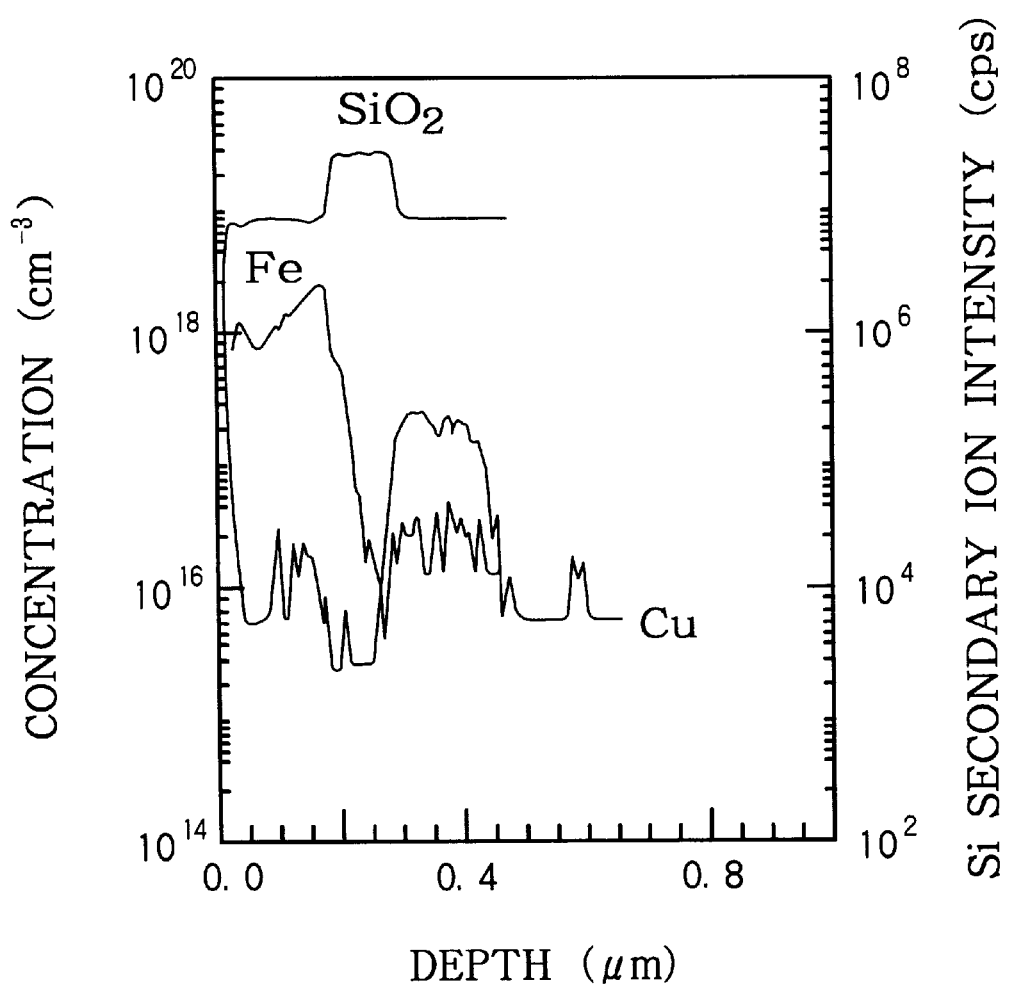
FIG. 23 is a result of SIMS (secondary ion mass spectroscopy) analysis of the same substrate.

FIG. 23 is a result of SIMS (secondary ion mass spectroscopy) analysis of the same substrate. It is noted from these results that results of chemical analysis and results of SIMS coincide well and that the embodiment of the invention etches the thin-film silicon layer and the buried oxide film, separating them clearly.

As understood from these results, according to the embodiment of the invention, by etching respective layers of the SOI wafer while controlling the temperature in a time sequence for etching of each layer, it is possible to etch them by precisely separating individual layers without over-etching and to conduct their analysis.

Heretofore, embodiments of he invention have been explained with reference to specific examples. However, the invention is not limited to these specific examples. For instance, the object to be etches is not limited to silicon, and the invention is similarly applicable to other various single-element materials or their compound materials, such as germanium (Ge), silicon germanium (SiGe), GaAs, InP, GaP, $SiO_2$, SiN, AlN, and promises the same or equivalent effects.

Furthermore, the etching solution used for etching is not limited to $HF/HNO_3$ solution, but those skilled in the art will be able to choose any appropriate one from other various kinds of solution, depending upon the object to be etched and the etching conditions, and will obtain the same effects.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No.H10-248626 filed on Sep. 2, 1998 including specification, claims, drawings and summary is incorporated herein by reference in its entirety.

What is claimed is:

1. An etching method for etching a surface of an object by exposing the surface of the object to an etching liquid, comprising:

heating or cooling said surface of said object, said heating or cooling being conducted unevenly on a space basis or a time basis in order to make etching of said object progress uniformly over the entirety of said surface.

2. The etching method according to claim 1 wherein said heating or cooling is conducted locally on said surface of said object.

3. The etching method according to claim 2 wherein said heating or cooling is conducted in order to minimize a temperature difference between a central part of said surface and a circumferential part of said surface exposed to said etching liquid during etching.

4. The etching method according to claim 3 wherein said central part of said surface is preferentially cooled compared to said circumferential part of said surface.

5. The etching method according to claim 2 wherein said heating or cooling is conducted to restrict convection currents of said etching liquid occurring between a central part of said surface and a circumferential part of said surface exposed to said etching liquid during etching.

6. The etching method according to claim 5 wherein said central part of said surface is preferentially cooled compared to said circumferential part of said surface.

7. The etching method according to claim 6 wherein a plate made of fluororesin is provided in touch with said object, said plate is thicker at said central part of said surface than at said circumferential part of said surface.

8. The etching method according to claim 2 wherein said etching liquid is an acidic solution.

9. The etching method according to claim 1 wherein said heating or cooling is conducted to control the temperature of said surface of said object to become higher in a final stage of etching than in an initial stage of said etching.

10. The etching method according to claim 9 wherein a cooling means for cooling said surface of said object is provided, the cooling power by said cooling means being large in said initial stage and small than in said final stage.

11. The etching method according to claim 9 wherein a heating means for heating said surface of said object is provided, the heating power by said heating means being small in said initial stage and large in said final stage.

12. The etching method according to claim 9 wherein said object is silicon, and said etching liquid is an acidic solution.

13. An etching method for etching a surface of an object by sandwiching an etching liquid in a gap between said object and a plate member facing to said object, comprising:

providing said plate member with a permeable means for permitting gases to pass through, and externally releasing gases generated by etching through said permeable means.

14. The etching method according to claim 13 wherein said permeable means permitting gases to pass through is at least one through hole formed in said plate member.

15. The etching method according to claim 14 wherein said through hole is made in form of inverted cones.

16. The etching method according to claim 15 wherein said plate member is placed at a higher position along the vertical line and said object is placed at a lower position along a vertical line.

17. The etching method according to claim 16 wherein said object is silicon, and said etching liquid is an acidic solution.

18. An etching apparatus for etching a surface of an object by sandwiching an etching liquid in a gap between said object and a plate member facing to said object, comprising:

said plate member having a permeable means for externally releasing gases generated by etching.

19. The etching apparatus according to claim 18 wherein said permeable means is at least one through hole formed in said plate member.

20. The etching method according to claim 19 wherein said through hole is made in form of inverted cones.

* * * * *